United States Patent
Jee

(10) Patent No.: US 11,646,067 B2
(45) Date of Patent: May 9, 2023

(54) DATA STORAGE DEVICE AND OPERATING METHOD THEREOF

(71) Applicant: SK hynix Inc., Gyeonggi-do (KR)

(72) Inventor: Dae Geun Jee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/407,557

(22) Filed: Aug. 20, 2021

(65) Prior Publication Data

US 2022/0262414 A1 Aug. 18, 2022

(30) Foreign Application Priority Data

Feb. 18, 2021 (KR) ........................ 10-2021-0021549

(51) Int. Cl.
*G11C 7/22* (2006.01)
*G11C 7/10* (2006.01)

(52) U.S. Cl.
CPC .............. *G11C 7/222* (2013.01); *G11C 7/109* (2013.01); *G11C 7/1063* (2013.01); *G11C 7/1066* (2013.01); *G11C 7/1093* (2013.01)

(58) Field of Classification Search
CPC .................................. G11C 7/222; G11C 7/22
USPC ....................................................... 365/233.1
See application file for complete search history.

(56) References Cited

U.S. PATENT DOCUMENTS

| 9,727,258 B1* | 8/2017 | Nazarian | ............... G06F 3/0659 |
| 2013/0041925 A1* | 2/2013 | Balko | ..................... G06F 8/656 |
| | | | 707/810 |
| 2020/0003833 A1* | 1/2020 | Grosz | .............. G01R 31/31726 |

FOREIGN PATENT DOCUMENTS

KR 10-1851614 B1 6/2018

* cited by examiner

*Primary Examiner* — Muna A Techane
(74) *Attorney, Agent, or Firm* — IP & T Group LLP

(57) ABSTRACT

A data storage device includes a nonvolatile memory device and a controller including a command parser configured to match a clock corresponding to each of a plurality of memory access types to generate a clock index matched with each of the memory access types and configured to determine, when a command is received, a memory access type of the command and the clock index matched with the determined memory access type by analyzing the command, and a memory interface configured to determine a locking value and the clock index corresponding to each of a plurality of clocks having different frequencies and change the locking value for processing of a command according to the clock index determined by the command parser.

16 Claims, 16 Drawing Sheets

| Memory Access Type | Clock Index | Locking Value |
|---|---|---|
| MAT (A) | Clock Index (0) | Locking Value (a) |
| MAT (B) | Clock Index (1) | Locking Value (b) |
| MAT (C) | Clock Index (2) | Locking Value (c) |
| ... | ... | ... |
| MAT (M) | Clock Index (n) | Locking Value (n) |

FIG. 7

| Memory Access Type | Clock Index | Locking Value |
|---|---|---|
| MAT (A) | Clock Index (0) | Locking Value (a) |
| MAT (B) | Clock Index (1) | Locking Value (b) |
| MAT (C) | Clock Index (2) | Locking Value (c) |
| ... | ... | ... |
| MAT (M) | Clock Index (n) | Locking Value (n) |

DATA STORAGE DEVICE AND OPERATING METHOD THEREOF

CROSS-REFERENCES TO RELATED APPLICATION

The present application claims priority under 35 U.S.C. § 119(a) to Korean Patent Application Number 10-2021-0021549, filed on Feb. 18, 2021, which is incorporated herein by reference in its entirety.

BACKGROUND

1. Technical Field

Various embodiments of the present disclosure may generally relate to a semiconductor device, and more particularly, to a data storage device and an operating method thereof.

2. Related Art

Data storage devices using memory devices have no mechanical driving units and exhibit good stability and endurance, fast information access rates, and low power consumption. Such data storage devices include a universal serial bus (USB) memory device, a memory card having various interfaces, a universal flash storage (UFS) device, a solid state drive (SSD), and the like.

Nonvolatile memory devices including NAND flash memory devices may operate as storage media of data storage devices.

Such NAND flash memory devices may have a performance difference between a write operation and a read operation caused by characteristics of memories. In general, a NAND physical layer (NAND PHY) may be configured to perform an operation for a NAND flash memory access and may operate at single frequency set in accordance with the read performance. Even though the NAND flash memory device has a performance difference between the read operation and the write operation, the NAND flash memory device operates at the single frequency. Accordingly, the NAND flash memory device may operate at unnecessarily high frequency in the write operation, and thus additional power consumption may be caused.

SUMMARY

Embodiments of the present disclosure are provided to a data storage device capable of optimizing power consumption by changing frequency according to a memory access type and an operating method thereof.

In an embodiment of the present disclosure, a data storage device may include: a nonvolatile memory device; and a controller. The controller may include: a command parser configured to match a clock corresponding to each of a plurality of memory access types to generate a clock index matched with each of the memory access types and configured to determine, when a command is received, a memory access type of the command and the clock index matched with the determined memory access type by analyzing the command; and a memory interface configured to determine a locking value and the clock index corresponding to each of a plurality of clocks having different frequencies and change the locking value for processing of a command according to the clock index determined by the command parser.

In an embodiment of the present disclosure, an operating method of a data storage device may include: matching a clock corresponding to each of a plurality of memory access types to generate a clock index matched with each of the memory access types; determining a locking value and the clock index corresponding to each of a plurality of clocks having different frequencies; determining, when a command is received, a memory access type of the command and the clock index matched with the determined memory access type by analyzing the command; changing the locking value for processing of a command operation according to the determined clock index; and processing the command based on the changed locking value.

In an embodiment of the present disclosure, a data storage device may include: a memory device; a parser configured to output a clock index, which is selected according to a type of an access command among a plurality of clock indexes respectively representing a plurality of clocks having different frequencies; a control block configured to output, from information representing pairs of locking values and the clock indexes respectively corresponding to the clocks, a locking value selected according to the selected clock index; and a data slicer configured to select, according to the selected locking value, one of data pieces respectively captured from input data according to the clocks, wherein the selected data piece is to be provided to an external or the memory device in response to the access command.

According to the embodiments of the present disclosure, a frequency of a memory interface optimized for performance according to a memory access type may be used.

Further, since the frequency of the memory interface is optimized, unnecessary power consumption may be reduced.

These and other features, aspects, and embodiments are described in more detail below.

BRIEF DESCRIPTION OF THE DRAWINGS

The above and other aspects, features and advantages of the subject matter of the present disclosure will be more clearly understood from the following detailed description taken in conjunction with the accompanying drawings, in which:

FIG. 7 is a diagram illustrating an example of a locking table according to an embodiment of the present disclosure;

DETAILED DESCRIPTION

Various embodiments of the present teachings are described in detail with reference to the accompanying drawings. The drawings are schematic illustrations of various embodiments and intermediate structures. As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present teachings as defined in the appended claims.

The present teachings are described herein with reference to cross-section and/or plan illustrations of various embodiments of the present teachings. However, embodiments of the present teachings should not be construed as limiting the present teachings. Although a few embodiments of the present teachings are shown and described, it will be appreciated by those of ordinary skill in the art that changes may be made in these embodiments without departing from the principles and spirit of the present teachings.

Figure 1:
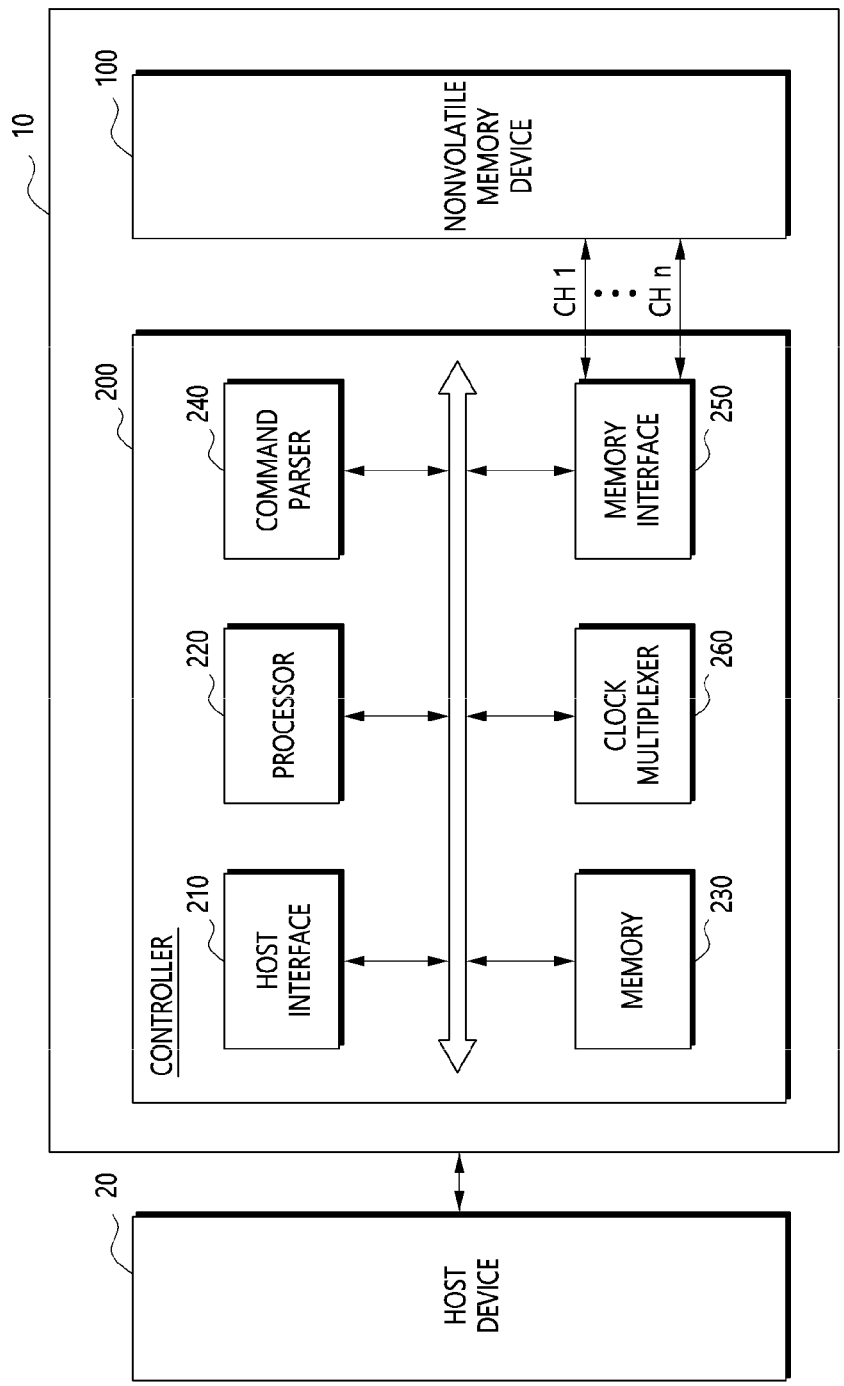
FIG. 1 is a diagram illustrating a configuration of a data storage device according to an embodiment of the present disclosure.
Figure 2:
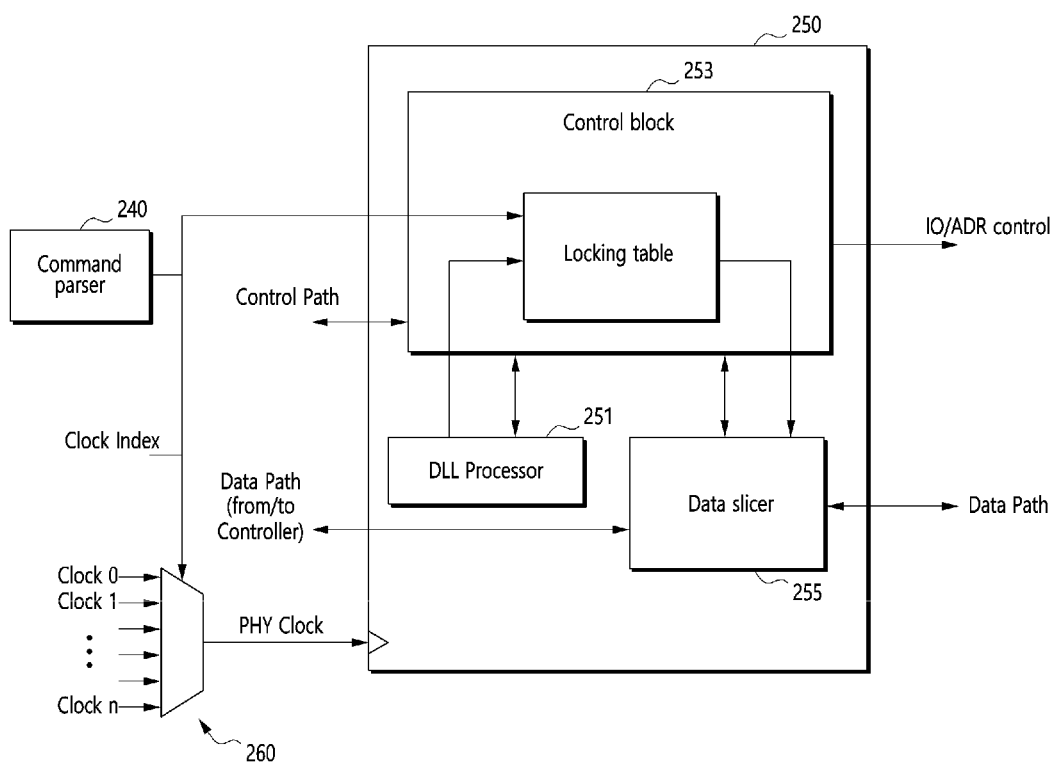
FIG. 2 is a detailed diagram illustrating a portion of a controller of FIG. 1 according to an embodiment of the present disclosure.

FIG. 1 is a diagram illustrating a configuration of a data storage device according to an embodiment of the present disclosure, and FIG. 2 is a detailed diagram illustrating a portion of a controller in FIG. 1, according to an embodiment of the present disclosure.

Referring to FIG. 1, a data storage device 10 according to an embodiment may store data to be accessed by a host device 20 such as a mobile phone, an MP3 player, a laptop computer, a desktop computer, a game player, a television (TV), an in-vehicle infotainment system, and the like. The data storage device 10 may refer to a memory system.

The data storage device 10 may be manufactured as any of various types of storage devices according to an interface protocol coupled to the host device 20. For example, the data storage device 10 may be configured of any of various types of storage devices, such as a solid state drive (SSD), a multimedia card in the form of MMC, eMMC, RS-MMC, and micro-MMC, a secure digital card in the form of SD, mini-SD, and micro-SD, a universal serial bus (USB) storage device, a universal flash storage (UFS) device, a personal computer memory card international association (PCMCIA) card type storage device, a peripheral component interconnection (PCI) card type storage device, a PCI-express (PCI-E) card type storage device, a compact flash (CF) card, a smart media card, a memory stick, and the like.

The data storage device 10 may be manufactured as any of various types of packages. For example, the data storage device 10 may be manufactured as any of various types of packages, such as a package on package (POP), a system in package (SIP), a system on chip (SOC), a multi-chip package (MCP), a chip on board (COB), a wafer-level fabricated package (WFP), and a wafer-level stack package (WSP).

The data storage device 10 according to an embodiment may include a nonvolatile memory device 100 and a controller 200.

The nonvolatile memory device 100 may be operated as a storage medium of the data storage device 10. The nonvolatile memory device 100 may include any of various types of nonvolatile memory devices according to a memory cell, such as a NAND flash memory device, a NOR flash memory device, a ferroelectric random access memory (FRAM) using a ferroelectric capacitor, a magnetic random access memory (MRAM) using a tunneling magneto-resistive (TMR) layer, a phase-change random access memory (PRAM) using a chalcogenide alloy, and a resistive random access memory (ReRAM) using a transition metal compound.

The nonvolatile memory device 100 may include a memory cell array (not shown) including a plurality of memory cells arranged in regions in which a plurality of word lines (not shown) and a plurality of bit lines (not shown) cross each other. For example, each of the memory cells in the memory cell array may be a single-level cell (SLC) in which a single bit data (for example, 1-bit data) is to be stored, a multi-level cell (MLC) in which 2-bit data is to be stored, a triple-level memory cell (TLC) in which 3-bit data is to be stored, and a quadruple-level cell (QLC) in which 4-bit data is to be stored. The memory cell array may include at least one or more memory cells of the SLC, the MLC, the TLC, and the QLC. For example, the memory cell array may include memory cells arranged in a two-dimensional (2D) horizontal structure or memory cells arranged in a 3D vertical structure.

The controller 200 may control an overall operation of the data storage device 10 through driving of firmware or software loaded into a memory 230. The controller 200 may process a command CMD received from the host device 20 or generated by an internal operation itself. The controller 200 may generate control signals for controlling operations of the nonvolatile memory device 100 based on the command CMD received from the host device 20 and provide the generated control signals to the nonvolatile memory device 100. The controller 200 may decode and drive a code-type instruction or algorithm such as firmware or software. The controller 200 may be implemented with hardware or a combination of hardware and software.

The controller 200 may include a host interface 210, a processor 220, the memory 230, a command parser 240, a memory interface 250, and a clock multiplexer 260.

Although not shown in FIG. 1, the controller 200 may further include an error correction code (ECC) engine which generates a parity by performing ECC encoding on write data provided from the host device 20 and performs ECC decoding on read data read out from the nonvolatile memory device 100 using the parity. The ECC engine may be provided inside or outside the memory interface 250.

The host interface 210 may perform interfacing between the host device 20 and the data storage device 10 in response to a protocol of the host device 20. For example, the host interface 210 may communicate with the host device 20 through communication standards or interfaces. Examples include a USB protocol, a UFS protocol, an MMC protocol, a parallel advanced technology attachment (PATA) protocol, a serial advanced technology attachment (SATA) protocol, a small computer system interface (SCSI) protocol, a serial attached SCSI (SAS) protocol, a PCI protocol, and a PCI-E protocol.

The processor 220 may be configured as a micro control unit (MCU) and a central processing unit (CPU). The processor 220 may process requests transmitted from the host device 20. To process the requests transmitted from the host device 20, the processor 220 may drive a code-type instruction or algorithm (for example, firmware) loaded into the memory 230 and control operations of internal elements such as the host interface 210, the memory 230, and the memory interface 250 and the nonvolatile memory device 100.

The processor 220 may generate control signals for controlling operations of the nonvolatile memory device 100 based on requests transmitted from the host device 20 and provide the generated control signals to the nonvolatile memory device 100 through the memory interface 250.

The memory 230 may include a dynamic random access memory (DRAM) or a static random access memory (SRAM). The memory 230 may store firmware driven through the processor 220. The memory 230 may store data required for driving of the firmware, for example, metadata. For example, the memory 230 may operate as a working memory of the processor 220. Although not shown in FIG. 1, the controller 200 may further include a processor-dedicated memory arranged close to the processor 220, and the firmware and metadata stored in the memory 230 may be loaded into the processor-dedicated memory.

The metadata may refer to data generated and used in the controller 200 which directly controls the nonvolatile memory device 100, such as a firmware code, address mapping data, and data for managing user data.

The user data may be data generated and used in a software layer of the host device 20 controlled by the user, such as an application program code and a file.

The memory 230 may be configured to include a data buffer configured to temporarily store write data to be transmitted to the nonvolatile memory device 100 from the host device 20 or read data read from the nonvolatile memory device 100 and to be transmitted to the host device 20. For example, the memory 230 may operate as a buffer memory.

Although it is illustrated in FIG. 1 that the memory 230 is provided inside the controller 200, the memory 230 may be provided outside the controller 200.

The command parser 240 may analyze the command received from the host device 20 and determine a memory access type and output a clock index to match with the memory access type. The process of matching the clocks may refer to a process of determining the clocks to be used according to the plurality of memory access types in advance.

The memory interface 250 to be described later may determine locking values by performing locking processing on the determined clocks and perform indexing on the locking values, and thus a detailed description therefor will be described later.

The memory access type may refer to a kind of operation to process by the nonvolatile memory device 100 including write, sequential read, and random read. The memory access type may refer to a type of accessing the nonvolatile memory device 100 to process the command transmitted from the host device 20. The memory access type may be information acquired by parsing the command, and may have the same meaning as the command type such as write, sequential read, and random read. Different memory access types may require different clock speeds or different clock frequencies.

Figure 3:
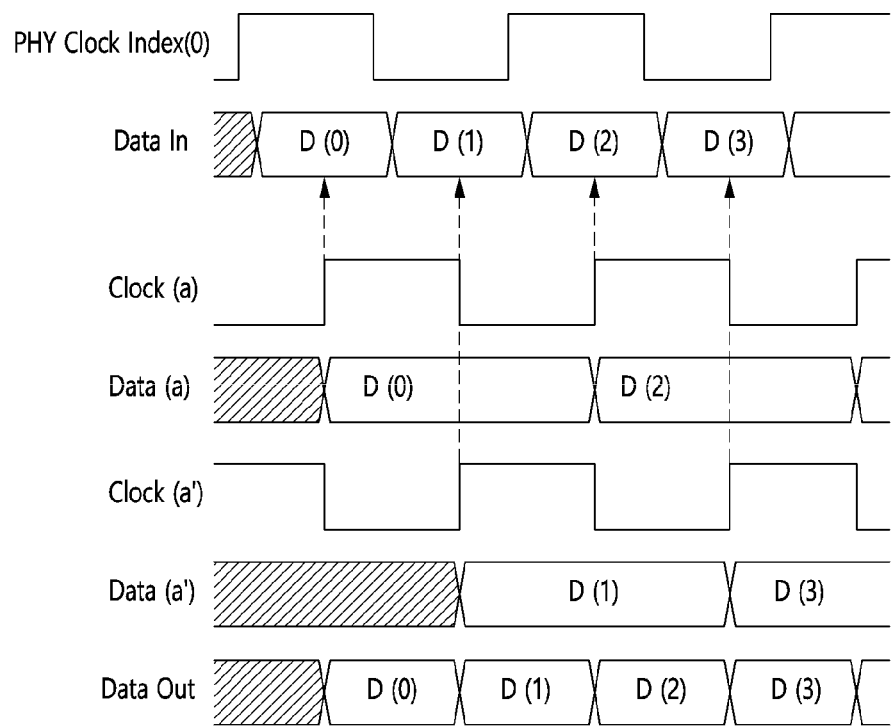
FIGS. 3 and 4 are diagrams illustrating an example of a command processing method according to an embodiment of the present disclosure.
Figure 4:
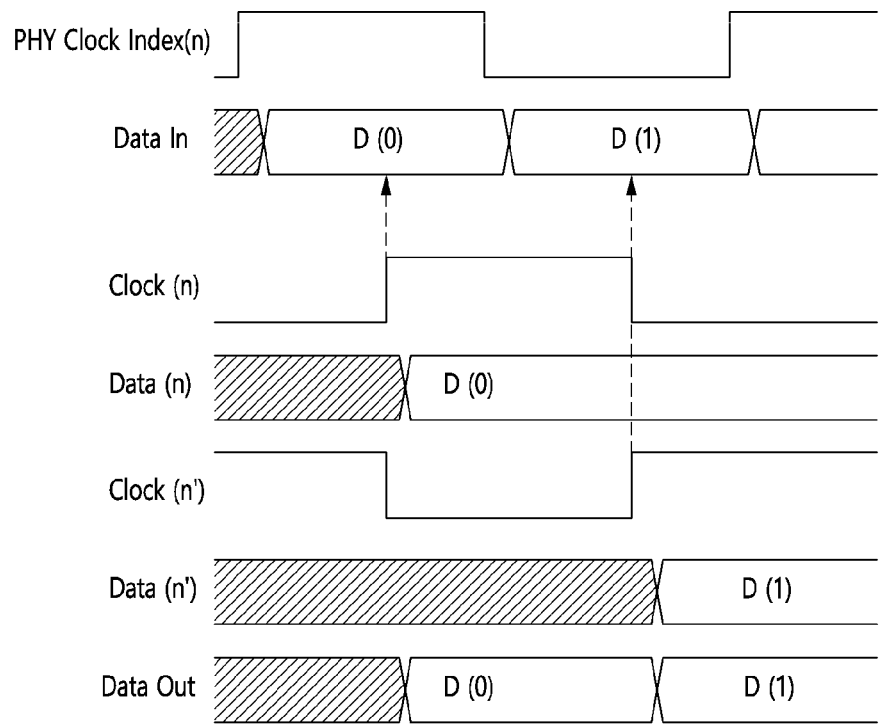

FIGS. 3 and 4 are diagrams illustrating an example of a command processing method according to an embodiment of the present disclosure.

As illustrated in FIGS. 3 and 4, the controller 200 may select a clock having a required speed corresponding to the memory access type such that a command corresponding to the memory access type is processed with the matched clock. For example, in a memory access type MAT(A) requiring high performance, the command parser 240 may allow a clock of PHY Clock index(0) to be selected and allow the memory interface 250 to operate with a relatively fast clock, as illustrated in FIG. 3. In a memory access type MAT(M) requiring low performance, the command parser 240 may allow a clock of PHY Clock index(n) to be selected and allow the memory interface 250 to operate as a relatively slow clock, as illustrated in FIG. 4. It can be seen from Data In states and Data Out states of FIGS. 3 and 4 that the clocks of Data In and Data Out in the memory access type requiring the high performance may be faster than those of Data In and Data Out in the memory access type requiring the low performance. Referring FIG. 3, the Clock(a) and the clock (a') are respectively delayed clock signals of the PHY clock by a set division ratio, and the Data(a) and the Data(a') are respectively captured data of input data Data in according to the Clock(a) and the clock(a'). Referring FIG. 3, the Clock (n) and the clock(n') are respectively delayed clock signals of the PHY clock by a set division ratio, and the Data(n) and the Data(n') are respectively captured data of input data Data in according to the Clock(n) and the clock(n'). The delayed clock and the captured data will be described in detail later.

The command parser 240 may control the memory interface 250 to perform locking processing of setting the locking values and clock indexes for the clocks matched with the plurality of memory access types, in an initial setup. However, this is not limited thereto, and the locking processing may be performed only through the memory interface 250 without control of the command parser 240. The above-described initial setup may be a process of storing the locking value and the clock index by performing locking processing on each clock when power first turns on and the memory interface 250 initially operates after the matching of the clocks for the plurality of memory access types is completed.

In a normal operation, the command parser 240 may search for a clock index corresponding to the command CMD transferred from the host device 20 and output the searched clock index with the memory access type to the memory interface 250. For the normal operation, the command parser 240 may have received and stored the clock indexes for the plurality of memory access types from the memory interface 250. The above-described normal operation may refer to an operation which parses and processes the command transferred from the host device 20 after the locking values and the clock indexes for the plurality of memory access types are determined through the locking processing.

As illustrated in FIG. 2, in a normal operation, the clock index output from the command parser 240 may be transferred to the control block 253 of the memory interface 250 and the clock multiplexer 260. Based on the transferred clock index, the control block 253 may search for the locking value corresponding to the corresponding clock index and output the searched locking value, and the clock multiplexer 260 may switch the corresponding clock.

The memory interface 250 may control the nonvolatile memory device 100 according to control of the processor 220. When the nonvolatile memory device 100 is configured of NAND flash memories, the memory interface 250 may refer to a flash control top (FCT). The memory interface 250 may transmit control signals generated through the processor 220 to the nonvolatile memory device 100. The control signals may include commands, addresses, operation control signals, and the like for controlling operations of the nonvolatile memory device 100. For example, the operation control signals may include a chip enable signal, a command latch enable signal, an address latch enable signal, a write enable signal, a read enable signal, a data strobe signal, and the like, but the operation control signals are not limited thereto. Further, the memory interface 250 may transmit write data to the nonvolatile memory device 100 or receive read data from the nonvolatile memory device 100.

The memory interface 250 and the nonvolatile memory device 100 may be coupled through a plurality of channels CH1 to CHn. The memory interface 250 may transmit signals such as commands, addresses, operation control signals, and data (for example, write data) to the nonvolatile memory device 100 through the plurality of channels CH1 to CHn. Further, the memory interface 250 may receive status signals (for example, ready/busy), data (for example, read data), and the like from the nonvolatile memory device 100 through the plurality of channels CH1 to CHn.

Referring to FIG. 2, the memory interface 250 may determine the locking values and clock indexes respectively corresponding to the plurality of clocks Clock 0 to Clock n and change the locking value for an inner operation according to the clock index transferred from the command parser 240.

Specifically, the memory interface 250 may determine the locking values corresponding to the plurality of clocks Clock 0 to Clock n and generate a locking table (refer to FIG. 7) by performing clock indexing on the determined locking values. When the clock index is received from the command parser 240, the memory interface 250 may identify the locking value matched with the clock index from the locking table and process the command based on the identified locking value.

Figure 5:
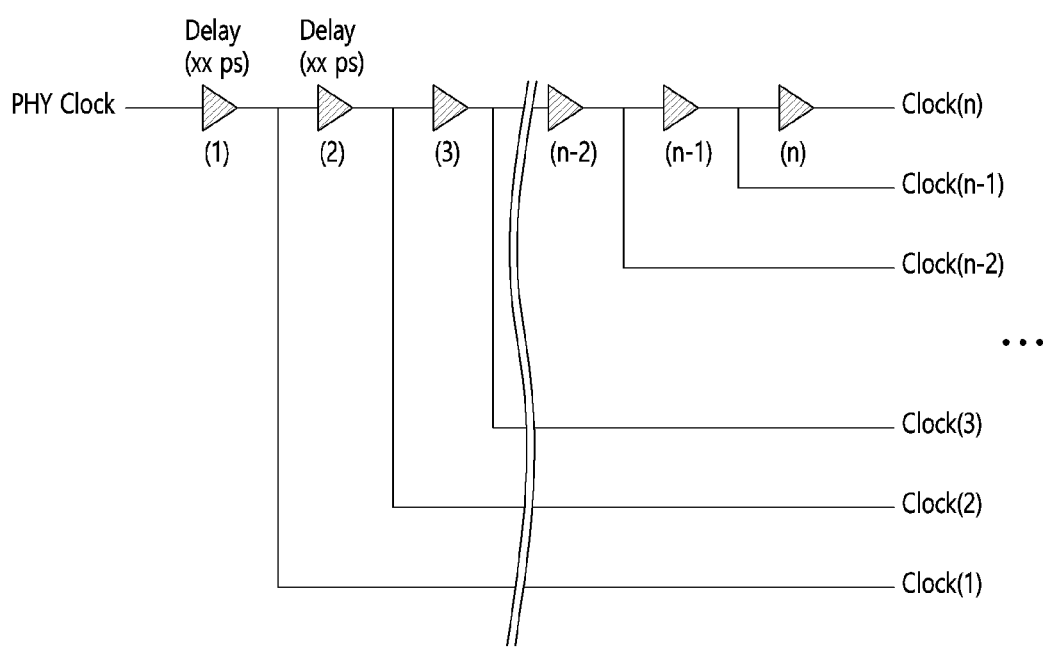
FIGS. 5 and 6 are diagrams for describing a method of performing locking processing according to an embodiment of the present disclosure.
Figure 6:
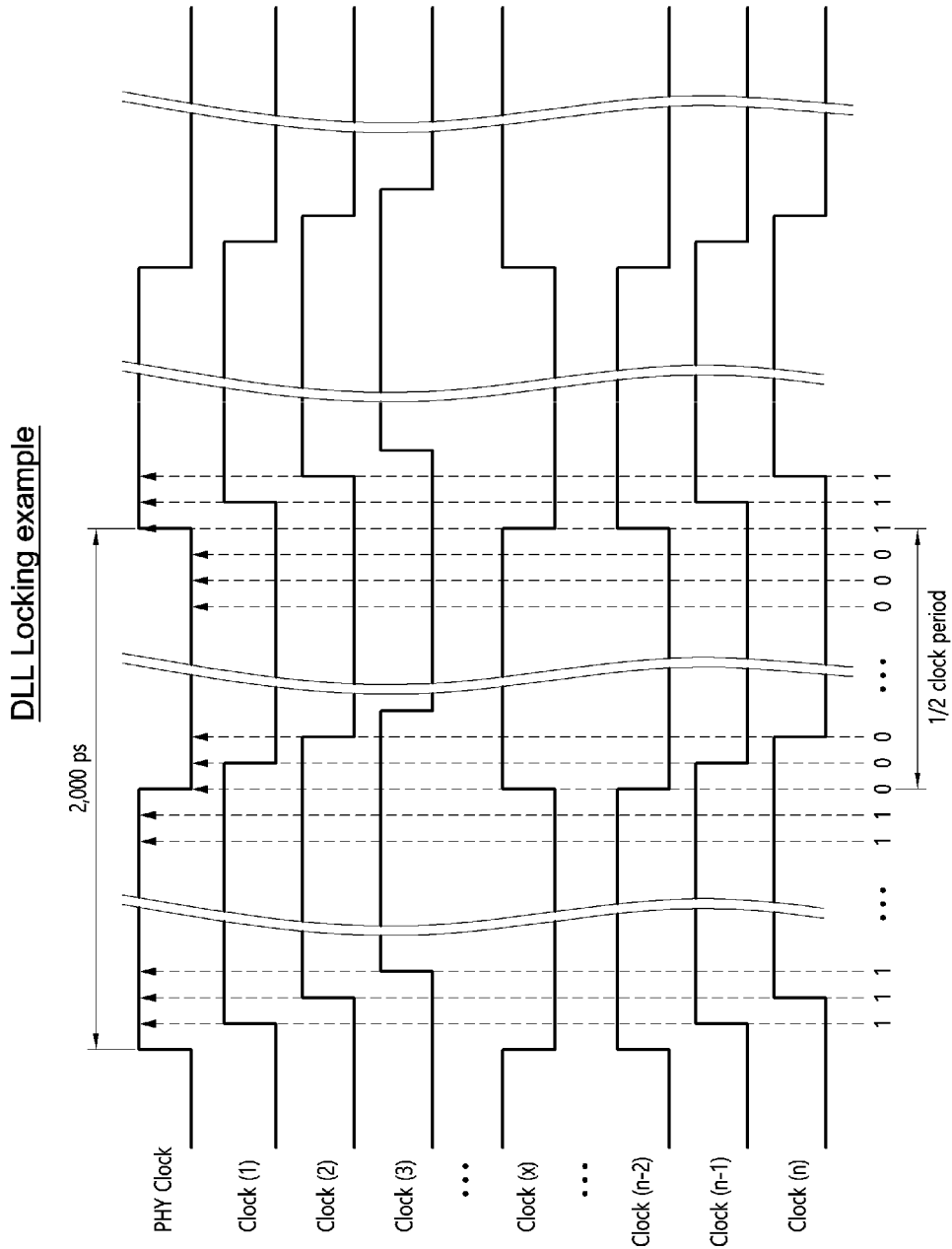

FIGS. 5 and 6 are diagrams for describing a method of performing locking processing according to an embodiment of the present disclosure, and FIG. 7 is a diagram illustrating an example of a locking table according to an embodiment of the present disclosure.

Referring to FIG. 2, the memory interface 250 may include a delay-locked loop (DLL) processor 251, the control block 253, and a data slicer 255.

The DLL processor 251 may be configured to detect the clock cycle and perform locking processing of setting an intermediate value of the detected clock cycle as the locking value.

In the embodiment, the locking value for multi-frequency clocks Clock 0 to Clock n may be stored for dynamic clock control according to the memory access type, and the memory interface 250 may be controlled with a frequency suitable for the memory access type according to the clock index transferred from the command parser 240.

In the initial setup, the DLL processor 251 may set the locking value by performing locking processing on each of the clocks Clock 0 to Clock n to be used, and control the set locking value and the clock index matched with the locking value to be stored in advance.

Specifically, in the initial setup, the DLL processor 251 may perform DLL locking on the plurality of clocks Clock 0 to Clock n having different frequencies and generate the locking table including the clock indexes and the locking values matched with the clock indexes by performing indexing on the locking values corresponding to the plurality of clocks Clock 0 to Clock n. Referring to FIG. 7, the locking table generated in the DLL processor 251 may be transferred to and stored in the control block 253, but the storage form is not limited thereto.

Referring to FIG. 5, the DLL processor 251 may include a DLL configured of a plurality of delay cells (1), (2), . . . , (n−1), and (n). Each of the plurality of delay cells (1) to (n) may have a delay time of several picoseconds to several tens of picoseconds. The DLL processor 251 may receive the clock signal PHY Clock, and search for the number of delay cells for delaying the clock signal PHY Clock of one period and output the searched number of delay cells as the locking value.

For example, the DLL including the plurality of internal consecutive delay cells (1) to (n) may output a number of a delay cell including each of n delay clocks Clock (1) to Clock (n), each of which is the input clock signal PHY Clock delayed as the input clock signal PHY Clock passes through the delay cells (1) to (n). For example, the locking value may be the number of delay cells through which the clock signal PHY Clock passes up to the delay cell corresponding to the output number of the delay cell. Each of the delay clocks may have the delay time from several picoseconds to several tens of picoseconds.

As shown in FIG. 5, each of the delay cells (1) to (n) may include a delay buffer. A plurality of delay buffers included in the DLL may be coupled in series to delay the clock signal PHY Clock. The clock signal may be delayed by passing through the plurality of delay buffers.

Referring to FIGS. 5 and 6, the DLL processor 251 may determine the number of delay clocks that the period of the input clock signal PHY Clock can be captured by capturing the values of the delay clocks Clock(1) to Clock(n) that the input clock signal PHY Clock is delayed.

Referring to FIG. 6, as an example, when the delay of each delay cell is 10 picoseconds and the period of the input clock signal PHY Clock is 2,000 picoseconds (500 MHz), the input clock signal PHY Clock may be captured with 200 delay clocks. On the basis of the capturing result, the DLL processor 251 may acquire that the 50th delay clock corresponds to ¼ period of the input clock signal, the 100th delay clock corresponds to ½ period of the input clock signal, the 150th delay clock corresponds to ¾ period of the input clock signal, and the 200th delay clock corresponds to 1 period of the input clock signal. For example, the locking processing may be a process of finding a delay clock (or delay tab) value corresponding to ¼ period, ½ period, ¾ period, and 1 period of the input clock signal. In the embodiment, the delay clock value corresponding to ½ period of the input clock signal may refer to the locking value, but delay clock value is not limited thereto.

The DLL processor 251 may perform indexing on the locking value acquired through the locking processing and transmit the indexing result to the control block 253.

The control block 253 may store the locking table and when the clock index is received from the command parser 240, the control block 253 may search for the locking value matched with the clock index from the locking table and output the searched locking value.

As illustrated in FIG. 7, the control block 253 may match the clock indexes Clock Index(0) to Clock Index(n) for the memory access types MAT(A) to MAT(M) transferred from the DLL processor 251 and the locking values Locking Value(a) to Locking Value(n) with each other and store the matching result in a table form. In an embodiment, the clock index is an identifier of a clock signal set for each of the memory access type. The clock signals for each of the clock index may have same or different frequencies. The control block 253 may also receive only the locking values for the memory access types from the DLL processor 251 and then generate and store the locking table by performing index processing on the clock indexes for the locking values.

The control block 253 may transmit information for the locking table to the command parser 240 and control the command parser 240 to determine the clock index corresponding to the memory access type acquired by parsing the command transmitted from the host device 20.

The data slicer 255 may input and output data from and to the nonvolatile memory device 100 when processing the command of the host device 20 using the locking value transmitted from the control block 253.

Figure 8:
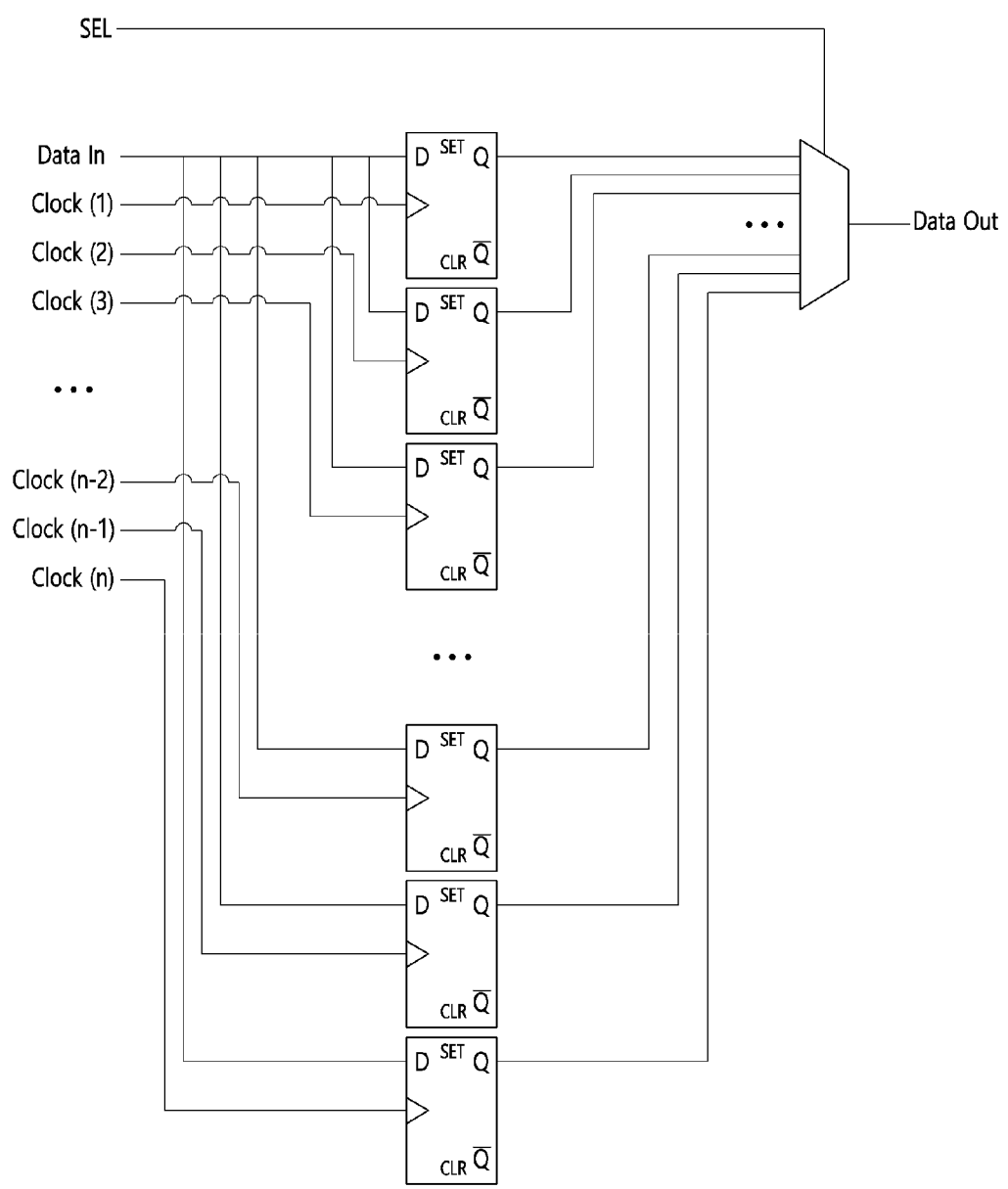
FIGS. 8 to 10 are diagrams for describing a data slicing method according to an embodiment of the present disclosure.
Figure 9:
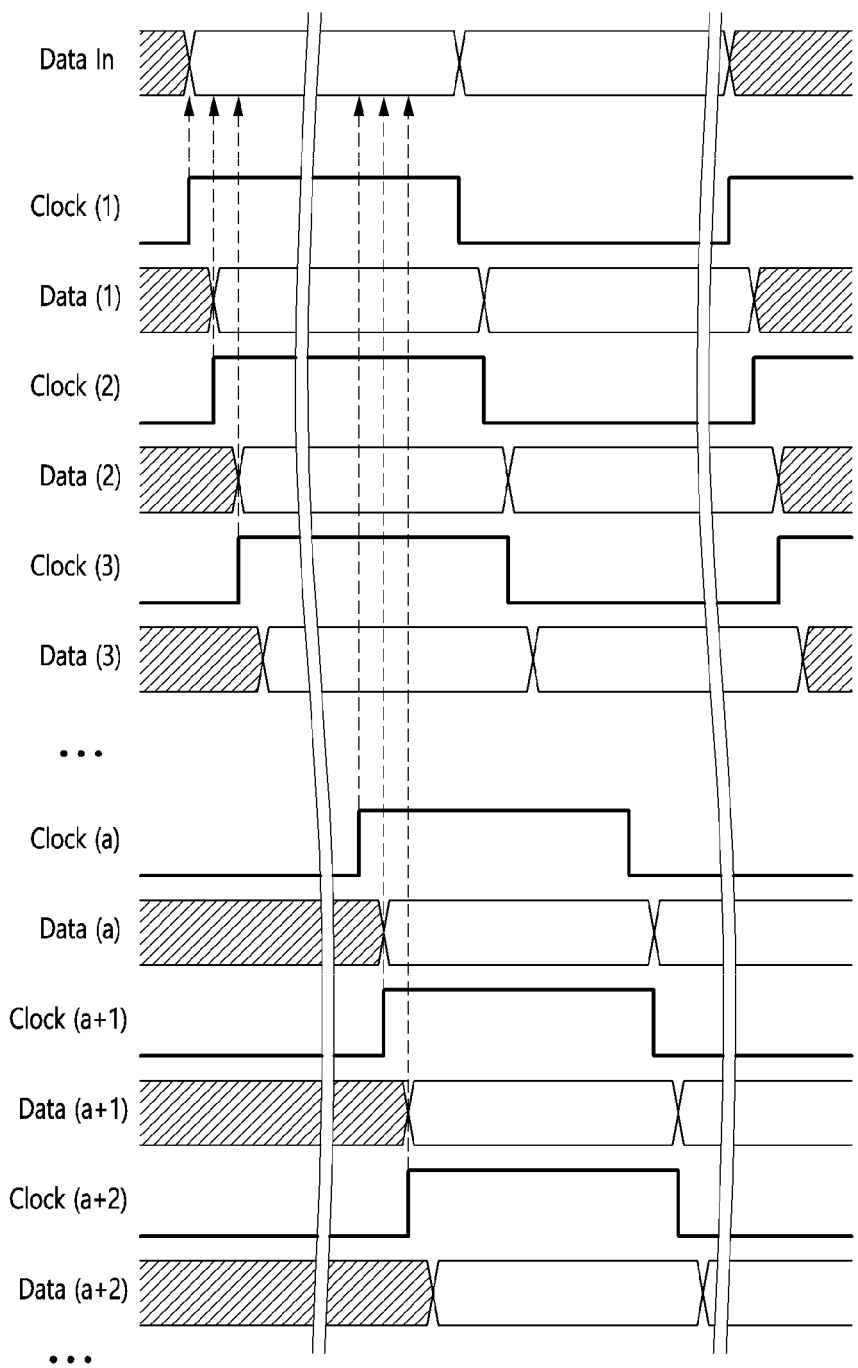
Figure 10:
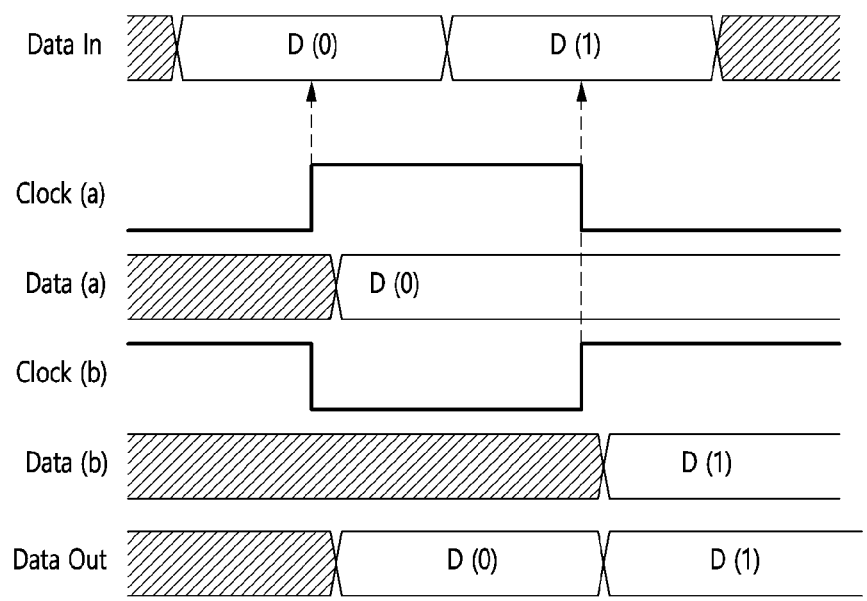

FIGS. 8 to 10 are diagrams for describing a data slicing method according to an embodiment of the present disclosure.

As shown in FIG. 8, the data slicer 255 may be configured to output stable data and include a plurality of flip flops. The data slicer 255 may capture data Data In input for command processing with the delay clocks Clock (1) to Clock (n) and output the captured data as output data Data Out based on the locking value SEL transmitted from the control block 253. The number of flip flops may be the same as the number of delay cells determined in the DLL processor 251.

Referring to FIGS. 9 and 10, when processing the command, on the basis of a timing diagram, the data slicer 255 may capture data Data In input for command processing with the delay clocks Clock(1) to Clock(a+2), as data Data(1) to Data(a+2) (see FIG. 9), and output data selected based on the corresponding locking value among the captured data Data(1) to Data(a+2) (see FIG. 10).

Referring to FIG. 10, the data slicer 255 may output the data Data Out by capturing input data D(0) and D(1) based on Clock(a) of ½ clock period and Clock(b) of ¾ clock period as the locking values acquired through the locking process.

In an embodiment, the above-described clock index may be set to implement the DLL locking values of the memory interface 250 with multi-frequency other than single frequency. In an embodiment, the memory interface 250 may refer to the same configuration as a NAND physical layer NAND PHY or a configuration including the NAND physical layer NAND PHY.

Figure 11:
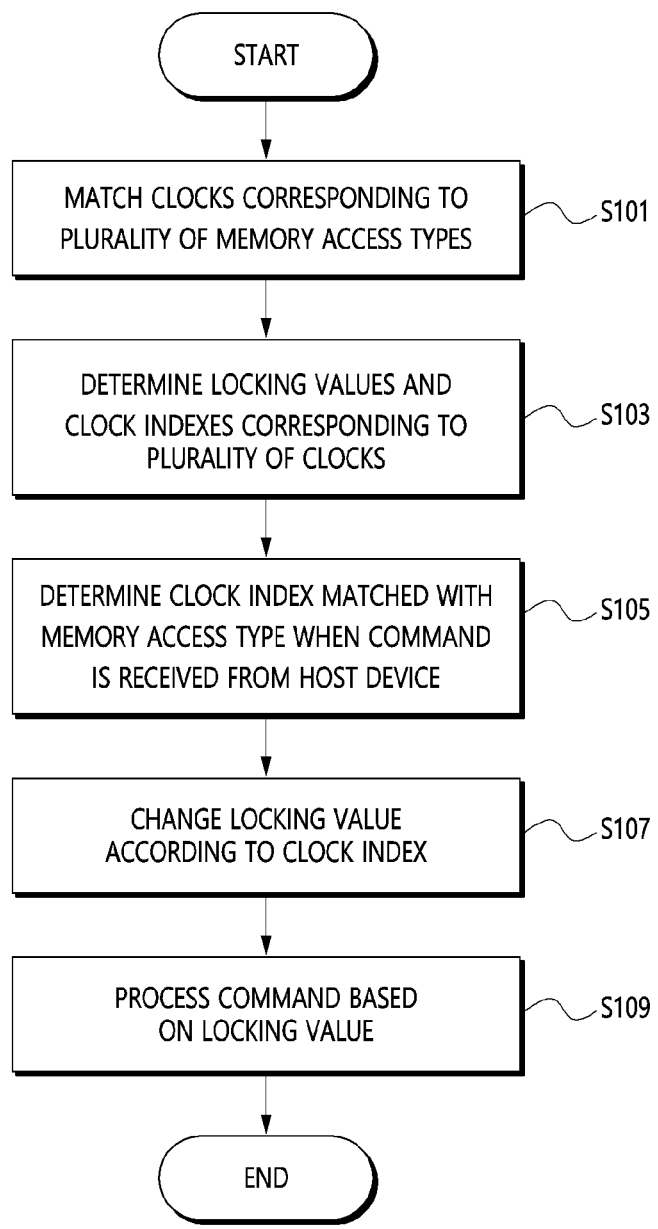
FIG. 11 is a flowchart describing an operating method of a data storage device according to an embodiment of the present disclosure.

FIG. 11 is a flowchart describing an operating method of a data storage device according to an embodiment of the present disclosure.

The data storage device 10 may match clocks corresponding to a plurality of memory access types (S101). The memory access type may refer to a type of accessing the nonvolatile memory device 100 including write, sequential read, and random read.

For example, the data storage device 10 may match the clock having a speed required according to the memory access type.

Next, the data storage device 10 may determine a locking value and a clock index corresponding to each of the plurality of clocks (S103).

Specifically, in the initial setup, the data storage device 10 may perform DLL locking processing on the plurality of clocks Clock 0 to Clock n and generate the locking table including the clock indexes and the locking values matched with the clock indexes by performing indexing on the locking values corresponding to the plurality of clocks.

When a command is received from the host device 20, the data storage device 10 may analyze the command and determine a memory access type and a clock index matched with the determined memory access type (S105).

The data storage device 10 may change the locking value for an inner operation according to the determined clock index (S107). For example, the data storage device 10 may search for the locking value matched with the clock index from the locking table based on the clock index and output the searched locking value. The above-described inner operation may refer to an operation which is performed by the memory interface 250 of the data storage device 10 to transmit data to the nonvolatile memory device 100 or to receive data from the nonvolatile memory device 100.

Next, the data storage device 10 may process the command of the host device 20 based on the locking value (S109).

Specifically, when processing the command, the data storage device 10 may capture data input for command processing with delay clocks based on a timing diagram, and select and output the captured data based on the locking value.

Figure 12:
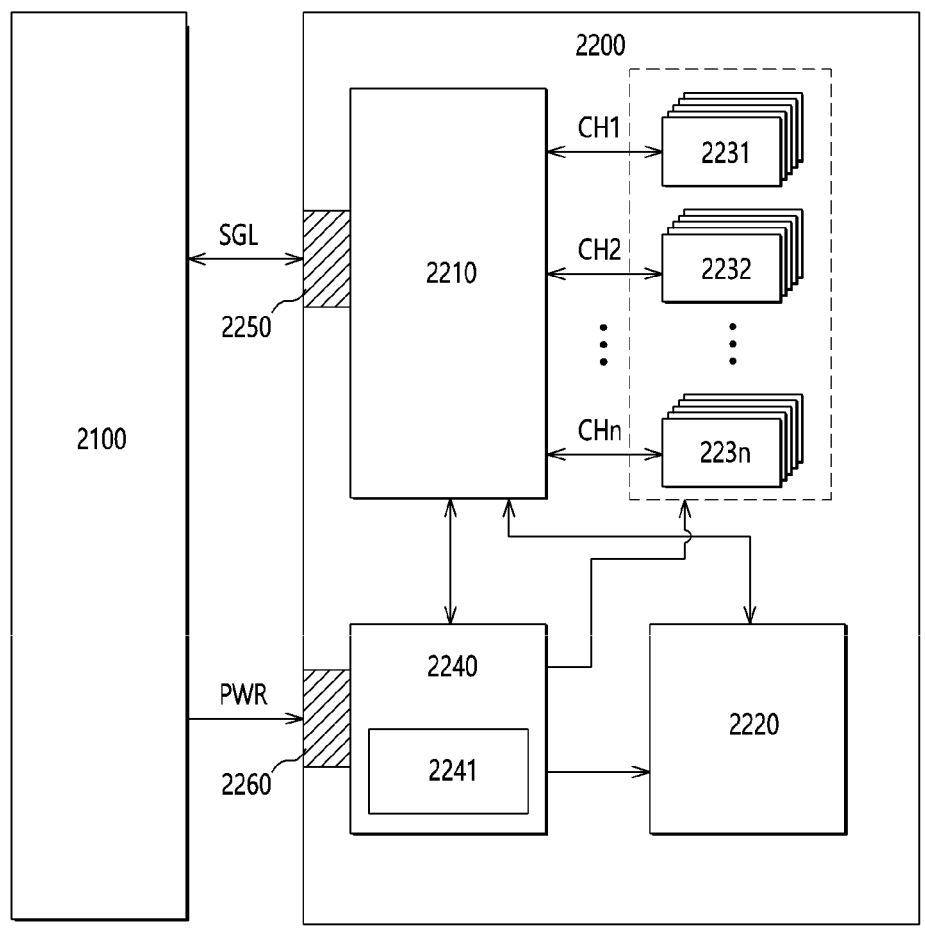
FIG. 12 is a diagram illustrating a data processing system including a solid state drive (SSD) according to an embodiment of the present disclosure.

FIG. 12 is a block diagram illustrating a data processing system including a solid state drive (SSD) according to an embodiment of the present disclosure. Referring to FIG. 12, a data processing system 2000 may include a host device 2100 and a solid state drive (SSD) 2200.

The SSD 2200 may include a controller 2210, a buffer memory device 2220, nonvolatile memory devices 2231 to 223n, a power supply 2240, a signal connector 2250, and a power connector 2260.

The controller 2210 may control an overall operation of the SSD 2200.

The buffer memory device 2220 may temporarily store data which are to be stored in the nonvolatile memory devices 2231 to 223n. Further, the buffer memory device 2220 may temporarily store data which are read out from the nonvolatile memory devices 2231 to 223n. The data temporarily stored in the buffer memory device 2220 may be transmitted to the host device 2100 or the nonvolatile memory devices 2231 to 223n according to control of the controller 2210.

The nonvolatile memory devices 2231 to 223n may be used as storage media of the SSD 2200. The nonvolatile memory devices 2231 to 223n may be coupled with the controller 2210 through a plurality of channels CH1 to CHn, respectively. One or more nonvolatile memory devices may be coupled to one channel. The nonvolatile memory devices coupled to the same channel may be coupled to the same signal bus and data bus.

The power supply 2240 may provide power PWR inputted through the power connector 2260 to the inside of the SSD 2200. The power supply 2240 may include an auxiliary power supply 2241. The auxiliary power supply 2241 may supply power to allow the SSD 2200 to be normally terminated when sudden power-off (SPO) occurs. The auxiliary power supply 2241 may include large capacity capacitors capable of charging the power PWR.

The controller 2210 may exchange a signal SGL with the host device 2100 through the signal connector 2250. The signal SGL may include a command, an address, data, and the like. The signal connector 2250 may be configured of various types of connectors according to an interface scheme between the host device 2100 and the SSD 2200.

Figure 13:
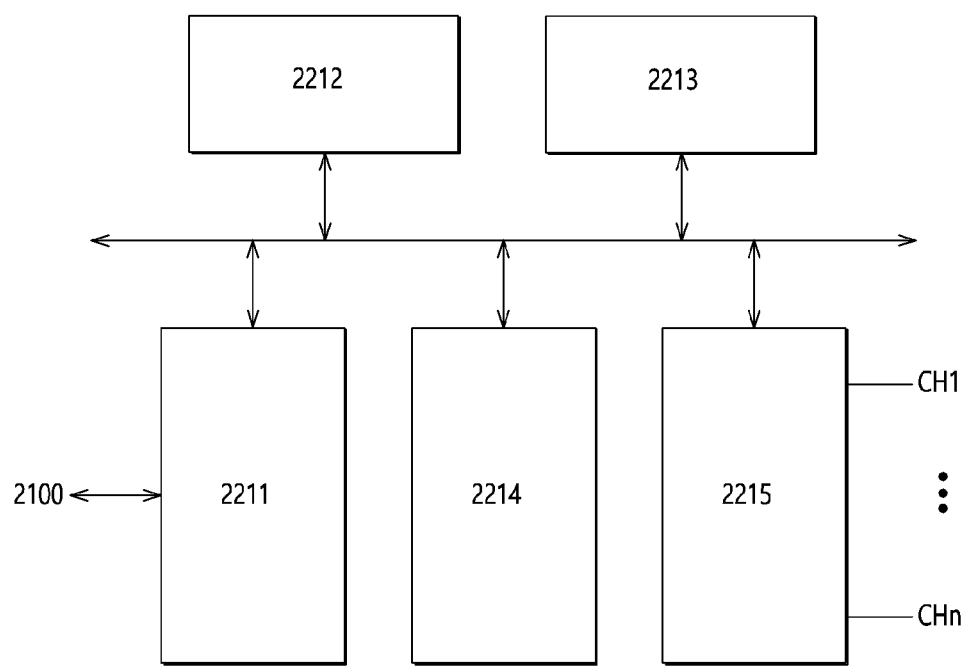
FIG. 13 is a diagram illustrating a configuration of a controller in FIG. 12, according to an embodiment of the present disclosure.

FIG. 13 is a block diagram illustrating the controller 2210 illustrated in FIG. 12, according to an embodiment of the present disclosure. Referring to FIG. 13, the controller 2210 may include a host interface 2211, a control block 2212, a random access memory 2213, an error correction code (ECC) block 2214, and a memory interface 2215.

The host interface 2211 may provide interfacing between the host device 2100 and the SSD 2200 according to a protocol of the host device 2100. For example, the host interface 2211 may communicate with the host device 2100 through any of SD, USB, MMC, embedded MMC (eMMC), PCMCIA, PATA, SATA, SCSI, SAS, PCI, PCI-E, and UFS protocols. In addition, the host interface 2211 may perform a disk emulating function of supporting the host device 2100 to recognize the SSD 2200 as a general-purpose data storage device, for example, a hard disk drive (HDD).

The control block 2212 may analyze and process the signal SGL inputted from the host device 2100. The control block 2212 may control operations of internal function blocks according to firmware or software for driving the SSD 2200. The random access memory 2213 may be used as a working memory for driving such firmware or software.

The ECC block 2214 may generate parity data of data to be transmitted to the nonvolatile memory devices 2231 to 223n. The generated parity data may be stored, along with the data, in the nonvolatile memory devices 2231 to 223n. The ECC block 2214 may detect errors of data read out from the nonvolatile memory devices 2231 to 223n based on the parity data. When the detected errors are within a correctable range, the ECC block 2214 may correct the detected errors.

The memory interface 2215 may provide control signals such as commands and addresses to the nonvolatile memory devices 2231 to 223n according to control of the control block 2212. The memory interface 2215 may exchange data with the nonvolatile memory devices 2231 to 223n according to control of the control block 2212. For example, the memory interface 2215 may provide data stored in the buffer memory device 2220 to the nonvolatile memory devices 2231 to 223n or provide data read out from the nonvolatile memory devices 2231 to 223n to the buffer memory device 2220.

Figure 14:
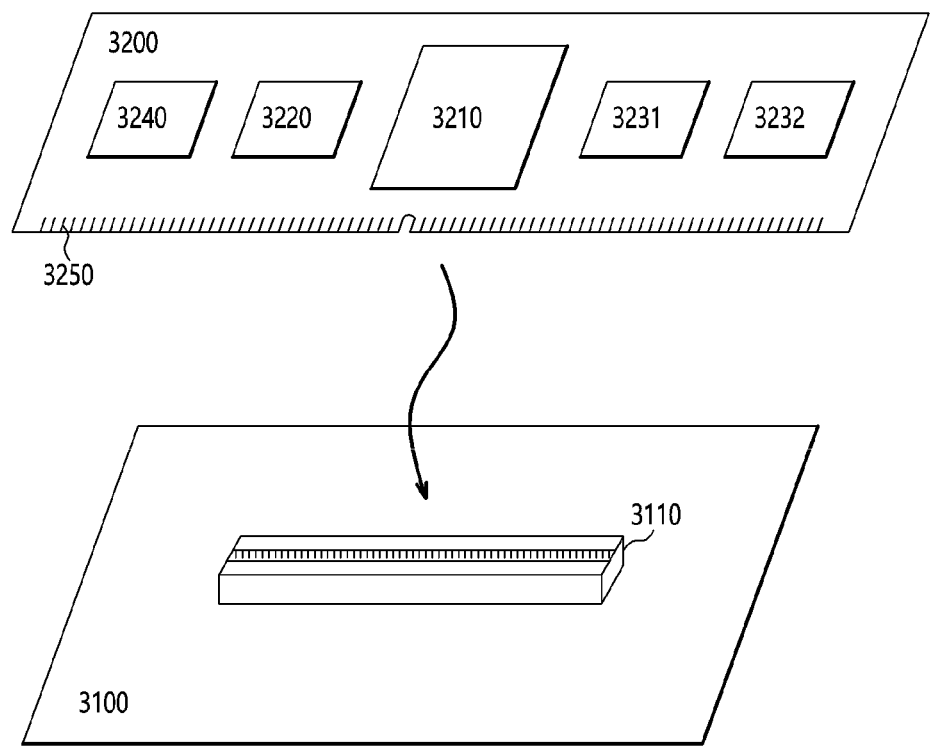
FIG. 14 is a diagram illustrating a data processing system including a data storage device according to an embodiment of the present disclosure.

FIG. 14 is a diagram illustrating a data processing system including a data storage device according to an embodiment of the present disclosure. Referring to FIG. 14, a data processing system 3000 may include a host device 3100 and a data storage device 3200.

The host device 3100 may be configured in the form of a board such as a printed circuit board. Although not shown in FIG. 14, the host device 3100 may include internal function blocks for performing functions of the host device.

The host device 3100 may include a connection terminal 3110 such as a socket, a slot or a connector. The data storage device 3200 may be mounted on the connection terminal 3110.

The data storage device 3200 may be configured in the form of a board such as a printed circuit board. The data storage device 3200 may refer to a memory module or a memory card. The data storage device 3200 may include a controller 3210, a buffer memory device 3220, nonvolatile memory devices 3231 and 3232, a power management integrated circuit (PMIC) 3240, and a connection terminal 3250.

The controller 3210 may control an overall operation of the data storage device 3200. The controller 3210 may be configured in the same manner as the controller 2210 shown in FIG. 13.

The buffer memory device 3220 may temporarily store data to be stored in the nonvolatile memory devices 3231 and 3232. Further, the buffer memory device 3220 may temporarily store data read out from the nonvolatile memory devices 3231 and 3232. The data temporarily stored in the buffer memory device 3220 may be transmitted to the host device 3100 or the nonvolatile memory devices 3231 and 3232 according to control of the controller 3210.

The nonvolatile memory devices 3231 and 3232 may be used as storage media of the data storage device 3200.

The PMIC 3240 may provide power inputted through the connection terminal 3250, to the inside of the data storage device 3200. The PMIC 3240 may manage the power of the data storage device 3200 according to control of the controller 3210.

The connection terminal 3250 may be coupled to the connection terminal 3110 of the host device 3100. Through the connection terminal 3250, signals such as commands, addresses, data and the like, and power may be transferred between the host device 3100 and the data storage device 3200. The connection terminal 3250 may be configured in various types depending on an interface scheme between the host device 3100 and the data storage device 3200. The connection terminal 3250 may be disposed on any side of the data storage device 3200.

Figure 15:
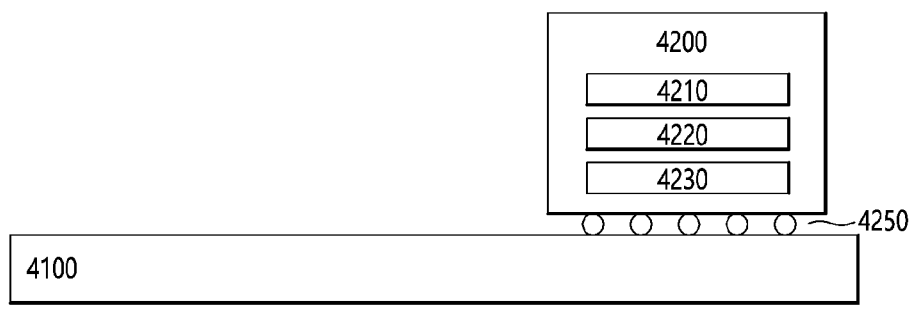
FIG. 15 is a diagram illustrating a data processing system including a data storage device according to an embodiment of the present disclosure.

FIG. 15 is a block diagram illustrating a data processing system including a data storage device according to an embodiment of the present disclosure. Referring to FIG. 15, a data processing system 4000 may include a host device 4100 and a data storage device 4200.

The host 4100 may be configured in the form of a board such as a printed circuit board. Although not shown in FIG. 15, the host device 4100 may include internal function blocks for performing functions of the host device.

The data storage device 4200 may be configured in the form of a surface-mounting type package. The data storage device 4200 may be mounted on the host device 4100 through solder balls 4250. The data storage device 4200 may include a controller 4210, a buffer memory device 4220, and a nonvolatile memory device 4230.

The controller 4210 may control an overall operation of the data storage device 4200. The controller 4210 may be configured in the same manner as the controller 2210 shown in FIG. 13.

The buffer memory device 4220 may temporarily store data to be stored in the nonvolatile memory device 4230. Further, the buffer memory device 4220 may temporarily store data read out from the nonvolatile memory device 4230. The data temporarily stored in the buffer memory device 4220 may be transmitted to the host device 4100 or the nonvolatile memory device 4230 according to control of the controller 4210.

The nonvolatile memory device 4230 may be used as a storage medium of the data storage device 4200.

Figure 16:
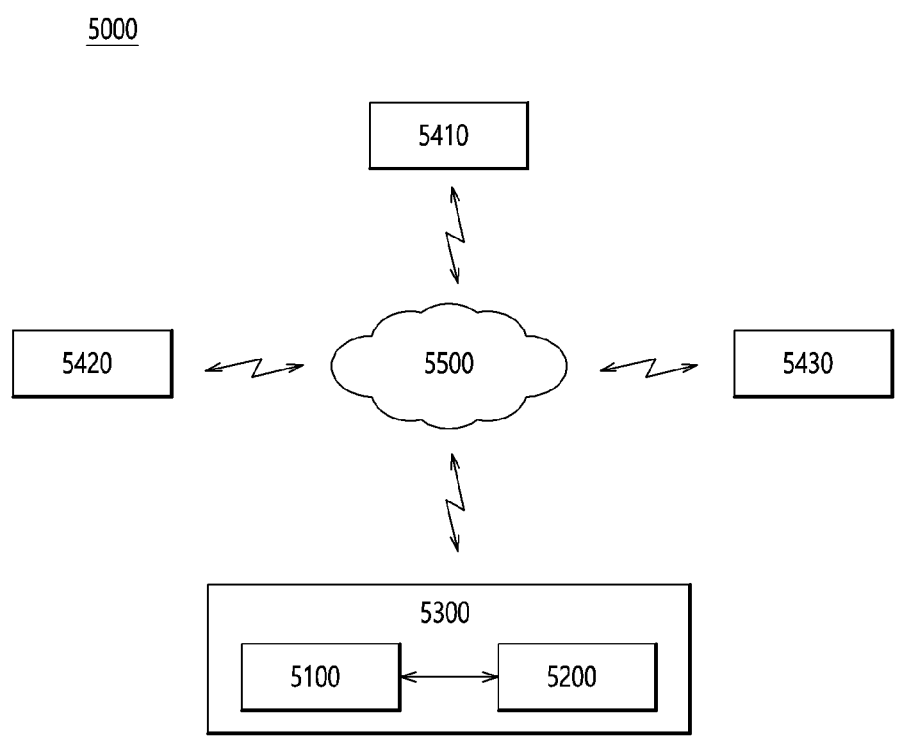
FIG. 16 is a diagram illustrating a network system including a data storage device according to an embodiment of the present disclosure.

FIG. 16 is a diagram illustrating a network system 5000 including a data storage device according to an embodiment of the present disclosure. Referring to FIG. 16, the network system 5000 may include a server system 5300 and a plurality of client systems 5410 to 5430 which are coupled to each other through a network 5500.

The server system 5300 may service data in response to requests from the plurality of client systems 5410 to 5430. For example, the server system 5300 may store data provided from the plurality of client systems 5410 to 5430. In another example, the server system 5300 may provide data to the plurality of client systems 5410 to 5430.

The server system 5300 may include a host device 5100 and a data storage device 5200. The data storage device 5200 may be configured of the data storage device 10 illustrated in FIG. 1, the data storage device 2200 illustrated in FIG. 12, the data storage device 3200 illustrated in FIG. 14, or the data storage device 4200 illustrated in FIG. 15.

Figure 17:
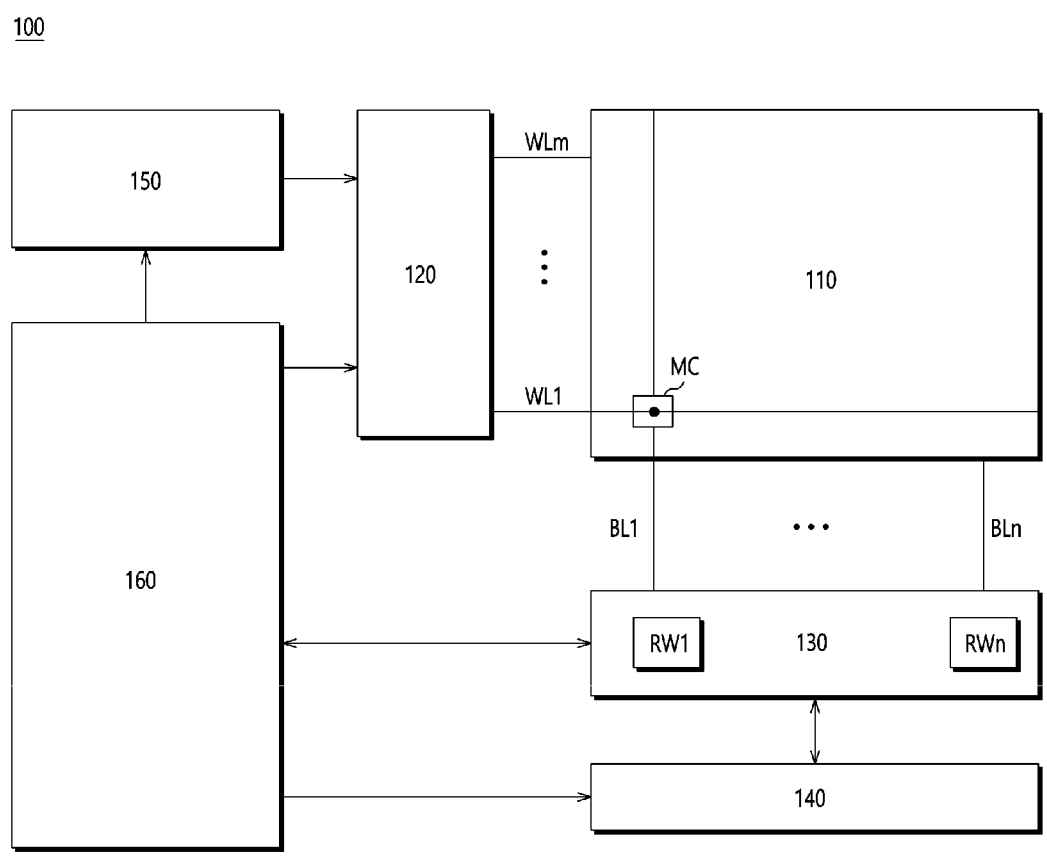
FIG. 17 is a block diagram illustrating a configuration of a nonvolatile memory device included in a data storage device according to an embodiment of the present disclosure.

FIG. 17 is a block diagram illustrating a nonvolatile memory device included in a data storage device according to the embodiment of the present disclosure. Referring to FIG. 17, the nonvolatile memory device 100 may include the memory cell array 110, a row decoder 120, a data read/write block 130, a column decoder 140, a voltage generator 150, and a control logic 160.

The memory cell array 110 may include the memory cells MC which are arranged in regions where word lines WL1 to WLm and bit lines BL1 to BLn cross each other.

The row decoder 120 may be coupled with the memory cell array 110 through the word lines WL1 to WLm. The row decoder 120 may operate according to control of the control logic 160. The row decoder 120 may decode addresses provided from an external device (not shown). The row decoder 120 may select and drive the word lines WL1 to WLm, based on the decoding results. For example, the row decoder 120 may provide word line voltages provided from the voltage generator 150, to the word lines WL1 to WLm.

The data read/write block 130 may be coupled with the memory cell array 110 through the bit lines BL1 to BLn. The data read/write block 130 may include read/write circuits RW1 to RWn corresponding to the bit lines BL1 to BLn. The data read/write block 130 may operate according to control of the control logic 160. The data read/write block 130 may operate as a write driver or a sense amplifier according to an operation mode. For example, the data read/write block 130 may operate as the write driver which stores data provided from the external device, in the memory cell array 110 in a write operation. In another example, the data read/write block 130 may operate as the sense amplifier which reads out data from the memory cell array 110 in a read operation.

The column decoder 140 may operate according to control of the control logic 160. The column decoder 140 may decode addresses provided from the external device. The column decoder 140 may couple data input/output lines or data input/output buffers with the read/write circuits RW1 to RWn of the data read/write block 130 which respectively correspond to the bit lines BL1 to BLn, based on decoding results.

The voltage generator 150 may generate voltages to be used in internal operations of the nonvolatile memory device 100. The voltages generated by the voltage generator 150 may be applied to the memory cells MC of the memory cell array 110. For example, a program voltage generated in a program operation may be applied to a word line of memory cells on which the program operation is to be performed. In another example, an erase voltage generated in an erase operation may be applied to a well region of memory cells on which the erase operation is to be performed. In still another example, a read voltage generated in a read operation may be applied to a word line of memory cells on which the read operation is to be performed.

The control logic 160 may control an overall operation of the nonvolatile memory device 100, based on control signals provided from the external device. For example, the control logic 160 may control operations of the nonvolatile memory device 100 such as read, write, and erase operations of the nonvolatile memory device 100.

The above described embodiments of the present invention are intended to illustrate and not to limit the present invention. Various alternatives and equivalents are possible. The invention is not limited by the embodiments described herein. Nor is the invention limited to any specific type of semiconductor device. The embodiments may be combined to form additional embodiments. Other additions, subtractions, or modifications are obvious in view of the present disclosure and are intended to fall within the scope of the appended claims.

What is claimed is:

1. A data storage device comprising:
a nonvolatile memory device; and
a controller including:
a command parser configured to match a clock corresponding to each of a plurality of memory access types to generate a clock index matched with each of the memory access types and configured to determine, when a command is received, a memory access type of the command and the clock index matched with the determined memory access type by analyzing the command; and
a memory interface configured to determine a locking value and the clock index corresponding to each of a plurality of clocks having different frequencies and change the locking value for processing of the command according to the clock index determined by the command parser.

2. The data storage device of claim 1, further comprising a clock multiplexer configured to be switched based on the clock index determined by the command parser to select a clock matched with the clock index determined by the command parser among the plurality of clocks and configured to output the selected clock to the memory interface.

3. The data storage device of claim 2,
wherein the memory interface is further configured to:
generate a locking table by performing clock indexing on the determined locking value,
identify the locking value matched with the clock index determined by the command parser from the locking table, and
process the command based on the identified locking value.

4. The data storage device of claim 2, wherein the memory interface includes:
a delay-locked loop (DLL) processor configured to perform DLL locking processing on the plurality of clocks and perform indexing on the locking value corresponding to each of the plurality of clocks to generate a locking table including the clock index matched with each of the memory access types and the locking value matched with the clock index matched with each of the memory access types, in initial setup; and
a control block configured to store the locking table, configured to search for the locking value matched with the clock index determined by the command parser from the locking table and configured to output the searched locking value.

5. The data storage device of claim 4, wherein the memory interface further includes a data slicer configured to input and output data from and to the nonvolatile memory device when processing the command using the searched locking value output from the control block.

6. The data storage device of claim 5, wherein when processing the command, the data slicer inputs and outputs the data from and to the nonvolatile memory device by capturing the data inputted for the command processing by delay clocks delayed based on the searched locking value output from the control block and outputting the captured data.

7. The data storage device of claim 1, wherein the memory access type is a type of accessing the nonvolatile memory device including write, sequential read, and random read.

8. The data storage device of claim 1, wherein the command parser matches the clock having a speed required by each of the memory access types.

9. An operating method of a data storage device comprising:
   matching a clock corresponding to each of a plurality of memory access types to generate a clock index matched with each of the memory access types;
   determining a locking value and the clock index corresponding to each of a plurality of clocks having different frequencies;
   determining, when a command is received, a memory access type of the command and the clock index matched with the determined memory access type by analyzing the command;
   changing the locking value for processing of the command according to the determined clock index; and
   processing the command based on the changed locking value.

10. The method of claim 9, wherein the determining of the locking value and the clock index includes performing DLL locking processing on the plurality of clocks and perform indexing on the locking value corresponding to each of the plurality of clocks to generate a locking table including the clock index matched with each of the memory access types and the locking value matched with the clock index matched with each of the memory access types, in initial setup.

11. The method of claim 10, wherein the changing of the locking value includes searching for the locking value matched with the determined clock index from the locking table and outputting the searched locking value.

12. The method of claim 11, wherein the processing of the command includes, when processing the command, capturing data inputted for the command processing by delay clocks delayed based on the searched locking value and outputting the captured data.

13. The method of claim 9, wherein the memory access type is a type of accessing a nonvolatile memory device including write, sequential read, and random read.

14. The method of claim 9, wherein the matching of the clock includes matching the clock having a speed required by each of the memory access types.

15. A data storage device comprising:
   a memory device;
   a parser configured to output a clock index, which is selected according to a type of an access command among a plurality of clock indexes respectively representing a plurality of clocks having different frequencies;
   a control block configured to output, from information representing pairs of each of a plurality of locking values and each of the plurality of clock indexes, a locking value selected according to the selected clock index; and
   a data slicer configured to select, according to the selected locking value, one of data pieces respectively captured from input data according to a clock corresponding to the selected clock index,
   wherein the selected data piece is to be provided to an external or the memory device in response to the access command.

16. The data storage device of claim 15, wherein the data slicer inputs and outputs the data from and to the memory device by capturing the data inputted for the command processing by delay clocks delayed based on the locking value and outputting the captured data.

* * * * *